(12) United States Patent
Price

(10) Patent No.: US 7,064,489 B2
(45) Date of Patent: Jun. 20, 2006

(54) HUFFMAN DATA COMPRESSION METHOD

(75) Inventor: Richard Price, Romsey (GB)

(73) Assignee: Roke Manor Research Limited, Romsey (GB)

( * ) Notice: Subject to any disclaimer, the term of this patent is extended or adjusted under 35 U.S.C. 154(b) by 237 days.

(21) Appl. No.: 10/381,718

(22) PCT Filed: May 1, 2001

(86) PCT No.: PCT/EP01/06699

§ 371 (c)(1),
(2), (4) Date: Oct. 10, 2003

(87) PCT Pub. No.: WO02/27664

PCT Pub. Date: Apr. 4, 2002

(65) Prior Publication Data

US 2004/0075596 A1    Apr. 22, 2004

(30) Foreign Application Priority Data

Sep. 28, 2000  (GB)  .................................. 0023765.1
Jan. 27, 2001  (GB)  .................................. 0102164.1

(51) Int. Cl.
*H03M 7/40*  (2006.01)
(52) U.S. Cl. .......................................... 314/65; 341/51
(58) Field of Classification Search ................. 341/62, 341/79, 51, 64, 67, 107, 65
See application file for complete search history.

(56) References Cited

U.S. PATENT DOCUMENTS

| | | | | |
|---|---|---|---|---|
| 4,862,167 A | * | 8/1989 | Copeland, III | 341/107 |
| 5,525,982 A | * | 6/1996 | Cheng et al. | 341/51 |
| 5,533,051 A | * | 7/1996 | James | 375/240 |
| 5,635,932 A | * | 6/1997 | Shinagawa et al. | 341/51 |
| 5,644,305 A | * | 7/1997 | Inoue et al. | 341/67 |
| 5,740,186 A | * | 4/1998 | Widmer | 714/753 |
| 5,784,631 A | * | 7/1998 | Wise | 382/246 |
| 6,040,790 A | | 3/2000 | Law | |
| 6,088,039 A | | 7/2000 | Broder et al. | |
| 6,292,115 B1 | * | 9/2001 | Heath | 341/87 |
| 6,484,142 B1 | * | 11/2002 | Miyasaka et al. | 704/500 |
| 6,492,918 B1 | * | 12/2002 | Rezzi et al. | 341/68 |
| 6,542,644 B1 | * | 4/2003 | Satoh | 382/246 |
| 6,563,438 B1 | * | 5/2003 | Satoh | 341/51 |
| 6,563,956 B1 | * | 5/2003 | Satoh et al. | 382/245 |

(Continued)

OTHER PUBLICATIONS

"JPEG Huffman Decoder" IBM Technical Disclosure Bulletin, IBM Corp. NY, vol. 36, No. 5, 1 May 1993 pp. 455-458.

(Continued)

*Primary Examiner*—Linh V. Nguyen
(74) *Attorney, Agent, or Firm*—Crowell & Moring LLP

(57) ABSTRACT

A method of compressing a character by determining an overall code specific to the character comprising the steps of:
a) grouping the characters in terms of a common behaviour pattern;
b) where the number of characters within that group is odd, creating a two new groups of character, one new group containing just one character and the other new group containing the remaining characters;
c) for each new group from of step b) said groups from step a) which have an even number of characters, assigning a group specific code d) where there is more than one character in the group referred to in step c) assigning a character identifier code to identify an individual character within the group,
e) the overall character code comprising of the cocatenated group specific and identifier codes.

7 Claims, 2 Drawing Sheets

U.S. PATENT DOCUMENTS 6,603,414 B1 * 8/2003 Postas .......................... 341/87
6,657,565 B1 * 12/2003 Kampf ......................... 341/51
6,748,520 B1 * 6/2004 Maynard et al. ............ 712/220

OTHER PUBLICATIONS

Marks, L.L; "Improved Grouping For Huffman Encoding" IBM Technical disclosure Bulletin, IBM Corp. NY, vol. 22, No. 5, 1979, p. 2107, No Month.

Svanbro, K et al: "Wireless Real-Time IP Services Enabled by Header Compression" VTC 2000 Spring—2000 IEEE $51^{st}$. Vehicular Technology Conference Proceedings. Tokyo, Japan, May 15-18, 2000 vol. 2 of 3, conf. 51, May 15, 2000 pp. 1150-1154.

Degermark, M et al: "Evaluation of CRTP Performance Over Cellular Radio Links" IEEE Personal Communications, IEEE Communications Society, US, vol. 7, No. 4, Aug. 2000, pp. 20-25.

* cited by examiner

HUFFMAN DATA COMPRESSION METHOD

This application is a 371 of PCT/EP01/06699, filed May 1, 2001, and is related to co-pending U.S. patent application Ser. No. 10/381,719, filed Oct. 10, 2003.

BACKGROUND OF THE INVENTION

Many digital communications systems send data in packets. These packets contain headers at the start of the data. The header comprises information relating, e.g., to the destination address of the packet, the length of the packet and the type of payload data contained inside. The header can be considered a long character comprising a string of bits.

Mobile telecom networks and the Internet are converging in terms of their functionality. It is desirable for third generation mobile handsets to understand Internet (IP or ATM) data packets directly to allow for seamless email, web browsing and multimedia services to the mobile user. Protocols such as IP are designed to run on fixed networks where bandwidth is plentiful, and so they are costly in the mobile phone environment. When used to carry speech, the overhead resulting in using IP can be up to 75% of the total network capacity, which is unacceptable for mobile networks.

One solution to this problem is to compress the IP header just before it crosses the air interface. A number of compression schemes exist for this purpose (Van Jacobson, CRTP etc.), which variously make trade-offs between efficiency, flexibility and simplicity.

Known data compression systems include the Huffman Algorithm. This publicly available standard is widely used in many compression schemes including "WinZip". Huffman encoding compresses a data stream one character at a time, where a character is usually one byte. The basic compression is not very efficient, but it is possible to obtain better results by applying the method recursively or by increasing the size of one character. However, this increases the processing and/or memory requirements of the algorithm.

In order to understand the invention the prior art will now be explained.

Ordinary Huffman

Huffman encoding is a publicly available compression standard used in many popular compression schemes such as "WinZip". All Huffman compressors work on a stream of characters (for example ASCII characters). The basic idea is to create a new set of compressed characters or codes, where each normal character maps onto a compressed character and vice versa. Frequently occurring, i.e. common characters, are given shorter compressed codes than rarely used characters, reducing the average size of the data stream. The compression ratio can be improved by increasing the size of one character, but at the expense of higher memory requirements. In fact the memory used when running a Huffman compressor grows exponentially with the character size, so 16-bit characters need 256 times as much memory as 8-bit characters.

FIG. 1 illustrates how ordinary Huffman works. In the example, it relates to 10 different possible characters (a set of 10 ASCII characters) as shown in single inverted commas (in general a character can be anything e.g. a byte, a header, an ASCII character etc). A prerequisite is to know, for the characters, the approximate probability of that character turning up in the data sequence, the skilled person would understand that this can be done in any appropriate way (e.g. a large stream of characters is taken and one determines how often each character appears).

In the worked example the ordinary Huffman tree needs 10 starting nodes, one for each possible character. These nodes are plotted at the top of the Huffman tree, together with the percentage chance that the character turns up in an uncompressed data-stream. The characters are ordered generally in terms of increasing probability. The space character is a very common character and put last. As shown in the figure, the box underneath each character shows the probability of occurrence. To build the tree, the two nodes with smallest probabilities are joined up to form a new node. The left-hand branch is labelled with a "1" and the right hand branch with a "0". The new node is obtained with a probability of the combined root nodes (in the first case this is 6%). This process continues until there is only one node left, at which point the tree is finished. In general, the branch with smallest probability is labelled with a "1", and the second smallest with a '0'. The sum of these two probabilities is placed in the new node. The completed Huffman tree for the worked example is shown below:

To compress a character one starts at the correct node and follow the tree down, reading off the '1's and '0's as they occur. The string of bits that this generates is the compressed character. e.g. "E" and follow the tree down to its root; this gives 0001. Thus E is represented by a 0001.

The compressed character is sometimes written backwards, so E is represented by 1000. This makes it easier to decompress (because we can follow the tree up by reading the compressed character from left to right).

Similarly, to decompress a character just follow the tree up using the compressed string of bits to decide whether to branch left or right at each node. Eventually one of the original ten nodes is reached and the correct decompressed character is discovered.

As can be seen, common characters are represented by fewer bits; a "space" character is represented here by a 0.

Improved Huffman

In a well-known enhanced method of compressing a stream of characters based on Huffman, each character is assigned a group and it is the groups which are treated as characters of the conventional Huffman algorithm. The method has significantly lower memory requirements than ordinary Huffman, allowing the size of one character to be increased and hence giving a better compression ratio. The improved Huffman method also uses a "character group" rather than the characters themselves to build a tree; the groups effectively become the characters of the ordinary Huffman.

The improved Huffman tree is constructed in two stages. In the first stage the characters are divided up into groups according to a common behavior pattern. A behavior pattern may e.g. be the same probability, so characters are grouped according to their relative frequency.

The problem however is that in a compressed character, the Huffman code for the group must be followed by a bit pattern identifying which character within the group has been compressed. If the group does not contain a power of two characters then bit patterns are wasted, giving poorer compression efficiency. The inventors have determined a method which overcomes these problems.

SUMMARY OF THE INVENTION

It is an object of the invention to provide an improved method of compression and subsequent decompression of headers and characters of binary (or other) data units.

The inventor has determined an improved method of compression of digital data which makes use of detecting behavior patterns in successive data blocks, which allows for efficient data compression. Behavior patterns are defined as any form of non-randomness and may take any appropriate form e.g. repeats, counters where the counter is incremented by 1, or where data blocks alternate between a small number of values.

The inventor has also developed an improved version of the Huffman method which has significantly lower memory requirements than ordinary Huffman, allowing the size of one character to be increased and hence giving a better compression ratio.

The invention comprises a method of compressing a character by determining an overall code specific to the character comprising the steps of:

a) grouping the characters in terms of a common behavior pattern;

b) where the number of characters within that group is odd, creating two new groups of character, one new group containing just one character and the other new group containing the remaining characters;

c) for each new group of step b) and said groups from step a) which have an even number of characters, assigning a group specific code d) where there is more than one character in the group referred to in step assigning a character identifier code to identify an individual character within the group, e) the overall character code comprising of the concatenated group specific and identifier codes.

Other objects, advantages and novel features of the present invention will become apparent from the following detailed description of the invention when considered in conjunction with the accompanying drawings.

DETAILED DESCRIPTION OF THE DRAWINGS

The invention will now be described in more detail with reference to examples.

EXAMPLE 1

Figure 1:
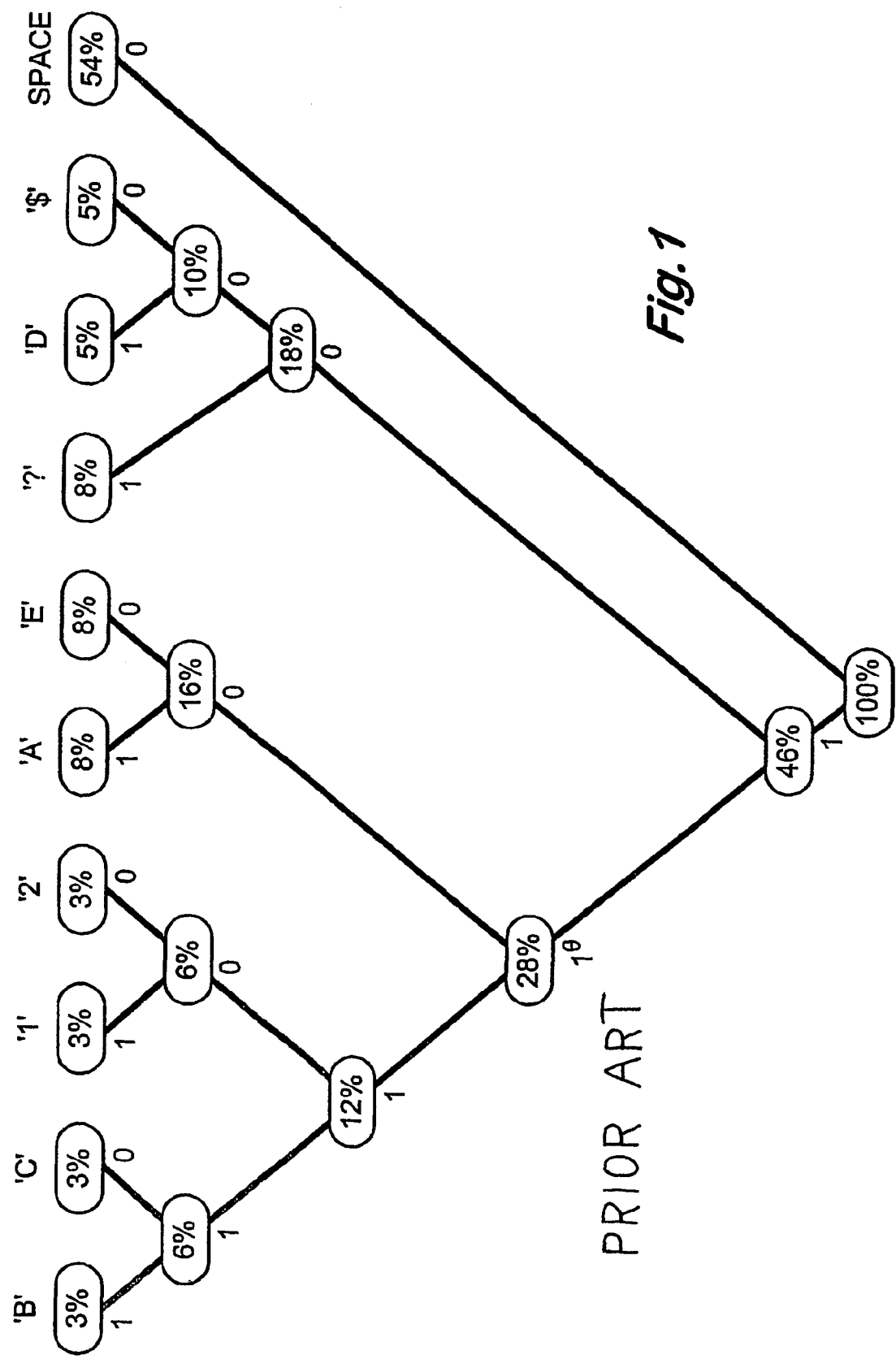
FIG. 1 is a diagram that illustrates the known ordinary Huffman compression.
Figure 2:
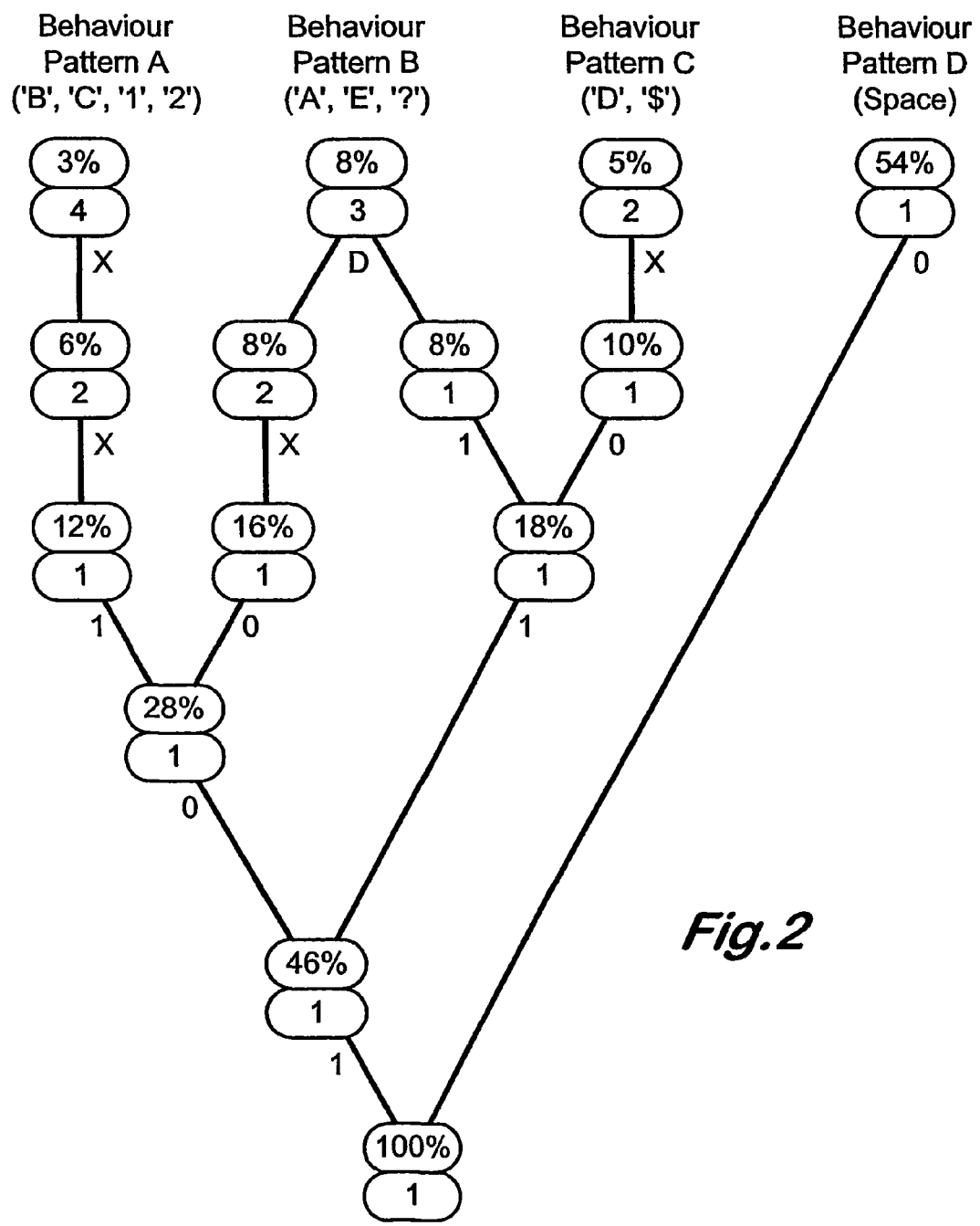
FIG. 2 is a diagrammatic depiction of data compression according to the invention.

A following simple basic example of the invention will now be described with reference to FIG. 2.

In the worked example there are 4 groups or behavior patterns. Group A contains all the characters that turn up with 3% probability, namely 'B', 'C', '1'and '2', and the other groups are set up depending on the probability of encountering the characters: Group B contains the characters 'A', 'E' and '?'. Group C includes 'D' and '$', and finally Group D contains just the SPACE character.

| Character | Chance of occurring | Group | Identifier |
|---|---|---|---|
| SPACE | 54% | A | |
| A | 8% | B | |
| E | 8% | B | |
| ? | 8% | B | |
| $ | 5% | C | |
| D | 5% | C | |
| 1 | 3% | D | 00 |
| 2 | 3% | D | 01 |
| B | 3% | D | 10 |
| C | 3% | D | 11 |

The tree initially starts with one node for each group (4 in total). The nodes are labelled with the number of characters in the group and the probability that one character in the group occurs in a random stream of characters.

To build the tree, there are three possible operations. Where there is an even number of characters in the group, put a node; this node is assigned double the probability, but the counter for the new node shows half the number of characters. The node is assigned a variable "X" of characters, which is filled in later depending on which character in the group is chosen to be compressed. Each time one moves further to the root of the tree a new node is created; the probability is doubled and the number of elements in the counter is halved. When the tree is used to compress data, the "X"s are filled in depending upon which character turns up. Rather than having multiple branching at the top of the tree one has a single track and a small array for an identifier.

E.g., in order to decompress this data the character code is 101011 1 go to left, 0 go to left, 1 go to left. One then knows its B, C, 1 or 2—the last 2 bits tell you which character it is.

Effectively the compressed code comprises two portions; one portion comprises the code which identifies the group, the group code. Again as with Huffman groups which e.g. contain characters which turn up very rarely, have longer group codes than those groups with common characters. The other portion of the compressed code comprises the identifier code which is the code which distinguishes it from other characters within the group. Groups with odd number of characters are split into two groups; one character removed to produce a new group having an even number of characters and a new group containing just one, the removed character.

If there is an odd number of characters in a group, the group is split up into two nodes. One branch represents just one of the characters; the other represents all the other characters and now represents a set having an even number of characters. The improved Huffman trees, at nodes where there is no branching, effectively contain an extra symbol 'X' to act as an identifier. Where there is branching from a group having an odd number of members there is an identifier "D" which is either 0 or 1 to indicate which branch is which after the aforementioned splitting, i.e. if the value of "D" is 1 this may represent the branch which represents the character which was removed from the group to provide an even numbered group, and a "0" the new even-numbered group.

The 'D' symbol is used to split the group up into two new groups. Since each new group has its own group identifier, there is no need to assign 0's and 1's to the 'D' symbol.

The 'X' identifiers in the original and new even groups identifies the character within the even group.

As mentioned the inventor has determined that to optimise efficiency, one can split one node into two nodes, which is indicated using a single digit identifier. In this specification, we refer to this as "D".

The "X"'s and "D"'s are in effect digits of the identifying code and serve to distinguish between any two characters with the same behaviour pattern. The initial step of compression is to label every character with a unique identification number that distinguishes it from other characters with the same behaviour pattern.

The general method of creating a tree for the improved Huffman algorithm is as follows:

Search for the node with the smallest probability. Suppose that this node contains n characters. The next step depends on the value of n:

1) If n is even then create a new node with double the probability but half the number of characters n. Join this new node to the old one, and label the branch with an 'X'.

2) If n is odd and n>1 then create two new nodes with the same probability, the one on the left containing n−1 characters and the one on the right containing 1 character. Join these new nodes to the old node, labelling the branches with a 'D'.

3) If n=1 then search for the node with the second-smallest probability. Suppose that this node contains m characters.

a) If m>1 then create two new nodes with the same probability, one containing m−1 characters and the other containing 1 character. Join these new nodes to the old node, labelling the branches with a 'D'.

b) There is now a node with smallest probability and a node with second-smallest probability, both containing one character. Join these nodes to form a new node containing one character. Label the branch with smallest probability using a '1' and the second-smallest using a '0'. Place the sum of the two probabilities in the new node.

For compression and decompression, each character in a group should be labelled with a unique identification number from the set {0, 1, 2, . . . }. This serves to distinguish between two characters in the same group.

Suppose that the character to be compressed has unique identifier i. Find the correct behaviour pattern on the tree and follow the tree down, taking these steps at each node:

1) If the node has a '0' or '1' branch then add this bit to the string of compressed bits.

2) If the label is 'X' then add the least significant bit of i to the string of compressed bits. Then divide i by 2 (rounded down).

3) For a label 'D' then if i is 0, follow the branch to the right. Otherwise decrease i by 1 and follow the branch to the left.

The resulting string of bits is the compressed character. Decompression is simply a matter of reversing this process, using the compressed bits to follow the tree back up to the correct behaviour pattern. The unique identifier i should be initially set to 0, and is reconstructed by taking the following steps at each node:

1) If the node branches then use the corresponding bit in the compressed string to determine which branch to follow.

2) If an 'X' is reached then multiply i by 2, and then increase i by 1 if the corresponding compressed bit is also '1'.

3) If a left-hand 'D' branch is reached then increase i by 1.

As can be seen, the difference between the two methods is that ordinary Huffman encoding needs a separate node for every character.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. A method of compressing a character by determining an overall code specific to the character, said method comprising:
   a) grouping characters in terms of a common behavior pattern;
   b) where the number of characters within a group in step a) is odd, creating two new groups of characters, one new group containing just one character and the other new group containing the remaining characters;
   c) for each new group in step b), and for said groups in step a) which have an even number of characters, assigning a group specific code; and
   d) where there is more than one character in a group referred to in step c) assigning a character identifier code to identify an individual character within the group; wherein,
   e) the overall character code comprising of the concatenated group specific and identifier codes.

2. The method as claimed in claim 1 wherein the sizes of said group codes are generally ordered according to a probability of the unit occurring.

3. A method as claimed in claim 2 wherein implementing a compression tree is performed using the following steps:
   i) arranging said data units into groups having, common behavior, and arranging these sets as nodes;
   ii) creating preliminary group end nodes by the following steps:
      a) for each node, if n, the number of characters within that group, is even, creating a new node with double the probability but half the number of characters n, joining this new node to the old one, labeling the branch with a single identifier 'X', and repeating until the number of character in the node is 1;
      b) where n is odd and n>1 creating two new nodes with the same probability, the one containing n−1 characters and one on the right containing 1 character and joining these new nodes to the old node, labeling the branches with an identifier 'D';
      c) for the node containing n−1 characters, creating a new node with half the number of characters, joining this new node to the old one, and labeling the branch with a single identifier 'X' and repeating until the number of character in the node is 1;
   iii) joining the preliminary group end nodes together, a pair at a time, and marking each pathway with a "1" or "0" until a single node is produced;
   iv) computing the compressed binary character by determining a group specific code comprising a string of "1"'s or "0"'s representing the path to the group terminal nodes and a character specific code represented by the string of identifiers; and
   v) concatenating group specific code and identifier codes.

4. A method as claimed in claim 1 wherein said behavior pattern is a common probability (range).

5. A method as claimed in claim 1 wherein in step d) the identifier code is of a minimum size to allow for each unit which could occur in that group to be assigned specifically.

6. A method as claimed in claim 1, wherein the identifier code comprises the character itself.

7. A method as claimed in claim 1, wherein the character is a header.

* * * * *